(12) United States Patent
Sakai et al.

(10) Patent No.: US 6,475,882 B1
(45) Date of Patent: Nov. 5, 2002

(54) METHOD FOR PRODUCING GAN-BASED COMPOUND SEMICONDUCTOR AND GAN-BASED COMPOUND SEMICONDUCTOR DEVICE

(75) Inventors: Shiro Sakai; Tao Wang, both of Tokushima (JP)

(73) Assignee: Nitride Semiconductors Co., Ltd., Naruto (JP)

( * ) Notice: Subject to any disclaimer, the term of this patent is extended or adjusted under 35 U.S.C. 154(b) by 0 days.

(21) Appl. No.: 09/650,949

(22) Filed: Aug. 29, 2000

(51) Int. Cl.[7] .......................... H01L 21/20; H01L 21/36
(52) U.S. Cl. ........................................ 438/483; 438/602
(58) Field of Search ............................ 438/46, 93, 483, 438/496, 503, 507, 509, 518, 602, 603, 604, 606, 680, 681, 930

(56) References Cited

U.S. PATENT DOCUMENTS

| | | | |
|---|---|---|---|
| 5,332,697 A | | 7/1994 | Smith et al. ................. 437/242 |
| 5,888,886 A | * | 3/1999 | Sverdlov et al. ............. 438/505 |
| 5,900,650 A | * | 5/1999 | Nitta ............................. 257/94 |
| 5,929,466 A | * | 7/1999 | Obba et al. .................. 257/103 |
| 6,030,848 A | * | 2/2000 | Yuge et al. .................... 438/46 |
| 6,090,666 A | | 7/2000 | Ueda et al. ................. 438/257 |

FOREIGN PATENT DOCUMENTS

| | | |
|---|---|---|
| EP | 0 779 666 A2 | 6/1997 |
| EP | 0 942 459 A1 | 9/1999 |
| JP | 4-297023 | 10/1992 |
| JP | 9-227298 | 9/1997 |
| JP | 10-22568 | 1/1998 |
| JP | 10-312971 | 11/1998 |
| JP | 11 111867 | 4/1999 |
| JP | 11-135832 | 5/1999 |
| JP | 11-145057 | 5/1999 |
| JP | 11-145516 | 5/1999 |
| JP | 11-266004 | 9/1999 |
| JP | 11-346032 | 12/1999 |
| JP | 11-346035 | 12/1999 |
| JP | 11-354839 | 12/1999 |
| JP | 11-354840 | 12/1999 |
| JP | 11-354842 | 12/1999 |
| JP | 2000-021789 | 1/2000 |
| JP | 2000-91252 | 3/2000 |
| JP | 2000-91253 | 3/2000 |
| JP | 2000-357820 | 12/2000 |

OTHER PUBLICATIONS

"InGaN/GaN/AIGaN–based Laser Diodes with Modulation–doped Strained–layer Superlattices Grown on an Epitaxially Laterally Overgrown GaN Substrate" Shuji Nakamura et al. Appl. Phys. Lett. 72 (2), Jan. 12, 1988, 1998 American Institute of Physics.

"Influence of Sapphire Nitridation on Properties of Gallium Nitride Grown by Metalorganic Chemical Vapor Deposition" S. Keller et al. Appl. Phys. Lett. 68(11), Mar. 11, 1996, 1996 American Institute of Physics.

(List continued on next page.)

*Primary Examiner*—David Nelms
*Assistant Examiner*—David Nhu
(74) *Attorney, Agent, or Firm*—Rosenthal & Osha L.L.P.

(57) ABSTRACT

A production method of a GaN-based compound semiconductor having excellent crystallinity and a GaN-based semiconductor device produced therefrom. A discrete SiN buffer body is formed on a substrate, and a GaN buffer layer is formed thereon at low temperatures and a GaN semiconductor layer is then formed at high temperatures. By forming the discrete SiN buffer body, the crystal growth, which is dependent on the substrate, of the low-temperature buffer layer is inhibited and monocrystallization is promoted to generate seed crystals used at the time of growing the GaN buffer layer. Further, by forming $SiO_2$ discretely between the substrate and the SiN buffer body or by forming InGaN or a superlattice layer on the GaN semiconductor layer, distortion of the GaN semiconductor layer is reduced.

21 Claims, 10 Drawing Sheets

OTHER PUBLICATIONS

"Fabrication and Characterization of Low Defect Density GaN Using Facet Controlled Epitaxial Lateral Overgrowth (FACELO)" K. Hiramatsu et al. ICMOVPE–X 2000 (Workbook), The Tenth International Conference on Metalorganic Vapor Phase Epitaxy, Jun. 5–9, 2000,Sapporo, Japan.

Drastic Reduction of the Dislocation Density in GaN Films by Anti–Surfactant–Mediated Dot Formation M. Takeuchi et al. ICMOVPE–X 2000 (Workbook), The Tenth International Conference on Metalorganic Vapor PHase Epitaxy Jun. 5–9, 2000, Sapporo, Japan.

"The effect of the Si/N Treatment of a Nitridated Sapphire Surface on the Growth Mode of GaN in Low–pressure Metalorganic Vapor Phase Eptaxy" S. Halfouz et al. Applied Physics Letters, vol. 73, No. 9, Aug. 1998.

"Growth of High–quality GaN by Low–pressure Metal–organic Vapour Phase Epitaxy (LP–MOVPE) from 3D Islands and Lateral Overgrowth" H. Lahréche et al. N.H Elsevier Journal of Crystal Growth 205 (1999) 245–252.

"Optimization of Si/N Treatment of Sapphire Surface and its Effect on the MOVPE GaN Overlayers" S. Haffouz et al. Phys. Stat. Sol. (a) 176,677 (1999).

"Influence of In Situ Sapphire Surface Preparation and Carrier Gas on the Growth Mode of GaN in MOVEPE" P. Vennégués et al. N.H Elsevier Journal of Crystal Growth 187 (1998) 167–177.

European abstract No. EP0497350, published Aug. 5, 1992, based on Japanese on Japanese Patent No. JP4–297023, published Oct. 21, 1992.

European Search Report, Feb. 28, 2002, 3 pages.

S. Haffouz et al.; "The Effect of the Si/N Treatment of a Nitridated Sapphire on the Growth Mode of GaN in Low –Pressure Metalorganic Vapor Phase Epitaxy," Applied Physics Letters, American Institute of Physics; New York, US, vol. 73, No. 9, Aug. 31, 1998, pp. 1278–1280.

S. Sakai et al.; "A new method of reducing dislocation density in GaN layer grown on sapphire substrate by MOVPE," Journal of Crystal Growth, North–Holland Publishing Co., Amsterdam, NL, vol. 221, No. 1–4, Dec. 2000, pp. 334–337.

Patent Abstracts of Japan, Publication No. 11111867, Apr. 23, 1999; 1 page.

Patent Abstracts of Japan, Publication No. 09227298 A; Sep. 2, 1997, 1 page.

Patent Abstracts of Japan, Publication No. 10022568 A; Jan. 23, 1998, 1 page.

Patent Abstracts of Japan, Publication No. 11135832 A, May 21, 1999, 1 page.

Patent Abstracts of Japan, Publication No. 11145057 A, May 28, 1999, 1 page.

Patent Abstracts of Japan, Publication No. 11145516 A, May 28, 1999; 1 page.

Patent Abstracts of Japan, Publication No. 11346032 A, Jan. 14, 1999, 1 page.

Patent Abstracts of Japan, Publication No. 11346035 A, Dec. 14, 1999, 1 page.

Patent Abstracts of Japan, Publication No. 2000091252 A, Mar. 31, 2000, 1 page.

Patent Abstracts of Japan, Publication No. 2000091253 A, Mar. 31, 2000, 1 page.

Patent Abstracts of Japan, Publication No. 2000357820 A, Dec. 26, 2000, 1 page.

Abstract (English translation), Patent No. JP10312971, Nov. 24, 1998, 1 page.

Abstract (English translation), Patent No. JP2000021789, Jan. 21, 2000, 1 page.

Official Action issued for Japanese counterpart application No. 2000–227963 with English translation, 7 pages.

K. Tominaga et al., "Preparation of conductive ZnO:Al films by a facing target system with a strong magnetic field," Thin Solid Films 253 (1994) 9–13 (5 pages).

M. Joseph et al., "p–Type Electrical Conduction in ZnO Thin Films by a Ga and N Codoping," Jpn. J. Appl. Phys. vol. 38 (1999) pp. L 1205–L 1207 Part 2, No. 11A, Nov. 1, 1999 (3 pages).

Patent Abstracts of Japan, Patent No. JP11354842; Dec. 24, 1999; 1 page.

Patent Abstracts of Japan, Patent No. JP11266004; Jan. 23, 2001; 1 page.

Patent Abstracts of Japan, Patent No. JP11354839; Dec. 24, 1999; 1 page.

Patent Abstracts of Japan, Patent No. JP11354840; Dec. 24, 1999; 1 page.

* cited by examiner

*Cross-sectional TEM image of "new GaN" and "conventional GaN"*

*New GaN(g=[2110]*

*Conventional GaN(g=[2110]*

METHOD FOR PRODUCING GAN-BASED COMPOUND SEMICONDUCTOR AND GAN-BASED COMPOUND SEMICONDUCTOR DEVICE

BACKGROUND OF THE INVENTION (i) Field of the Invention

The present invention relates to a method for producing a gallium nitride-based compound semiconductor on a substrate.

(ii) Description of the Related Art

Gallium nitride-based semiconductors are widely used in luminous devices such as LEDs, and in other applications. In production of GaN semiconductors, a blue laser which is operable continuously over 10,000 hours at room temperature has been reported (S. Nakamura et al, Apply.Phys.Lett.72, 211(1998)) for growing GaN on a sapphire substrate by using an ELO (Epitaxially Laterally Overgrown) method. In the ELO method, a GaN layer of several microns is formed on the sapphire substrate and an $SiO_2$ mask is formed in the form of stripes in the <1100> direction of GaN. $SiO_2$ formed in the form of stripes has an opening ratio of about 2:1. GaN is caused to grow again in a perpendicular direction from the openings of the $SiO_2$ mask, after which GaN is caused to grow in a horizontal direction so as to cover the $SiO_2$, thereby forming a continuous GaN layer. Thus, the dislocation density of the GaN layer covering the $SiO_2$ mask is reduced and a luminous device having the above properties is obtained.

However, in this ELO method, a reduction in dislocation density occurs only at the portions of the GaN layer where the $SiO_2$ mask exists, and only these portions exhibit good properties.

Meanwhile, in view of lattice mismatching between sapphire and GaN, it has also been proposed that a GaN or AlN buffer layer be grown on a sapphire substrate at low temperatures and then a GaN or GaAlN layer or the like be grown on that buffer layer. For example, Japanese Patent Application Laid-Open No. Hei 4-297023 discloses that a GaAlN buffer layer is caused to grow on a sapphire substrate at low temperatures and then a semiconductor layer such as GaN is further formed.

However, even in this method, high dislocation density occurs in the low-temperature buffer layer, so that high dislocation density also occurs in the GaN or GaAlN layer formed thereon. This is not satisfactory in obtaining a luminous device that is operable continuously over a long period of time.

SUMMARY OF THE INVENTION

Among the objects of the present invention are to provide a method which enables relatively simple reduction of dislocation density of a GaN-based compound semiconductor to a level at least that resulting from the ELO method, and to provide a GaN compound semiconductor device having low dislocation density.

To achieve the above objects, the present invention relates to a method for producing a GaN-based compound semiconductor, which comprises the steps of (a) forming a buffer body discretely on a substrate, (b) forming buffer layer on the buffer body, and (c) forming a GaN-based compound semiconductor layer on the buffer layer.

One aspect of the present invention further includes a step of forming a crystal nucleus generation-inhibiting layer discretely on the substrate prior to the step (a).

Another aspect of the present invention further includes a step (d) of forming an InGaN layer on the GaN-based compound semiconductor layer.

Still another aspect of the present invention further includes a step (d) of forming a superlattice layer having a quantum well structure on the GaN-based compound semiconductor layer.

Further, in the present invention, the step (a) can also be expressed as a step of forming a buffer body having multiple pores on a substrate.

Still further, in the present invention, the step (a) may also be a step of feeding $SiH_4$ and $NH_3$ to a substrate. In one aspect, the amounts of $SiH_4$ and $NH_3$ to be fed are such that an Si compound is formed in the form of islands on the substrate.

In the present invention, when a buffer layer is formed on a substrate (at relatively low temperatures) and a GaN-based compound semiconductor layer is further formed thereon, it is possible to reduce the dislocation density of the GaN-based compound semiconductor layer formed on the buffer layer if the dislocation density of the buffer layer can be reduced. The present inventor has found that by forming a buffer body discretely on a substrate, by forming a buffer body having multiple pores on a substrate, or by forming a buffer body in the form of islands on a substrate, buffer layer crystal growth, which is dependent on the substrate, is inhibited over the buffer body to suppress the occurrence of dislocations, and monocrystallization is promoted to generate seed crystals of a GaN-based compound semiconductor. More specifically, the buffer layer grows in a perpendicular direction from the pores of the buffer body formed discretely and, in time, the buffer layer grows in a horizontal direction so as to cover the buffer body. Growth of the buffer layer may be interrupted in the perpendicular direction from the pores, but not in the horizontal direction because the buffer layer is free from substrate influence. By controlling the degree of discretion of the buffer body or the number of its pores, the degree of crystal growth in the horizontal direction can also be controlled.

In one embodiment of the present invention, a buffer body is formed when the temperature of a substrate is 900° C. or lower. When a buffer body composed of a material such as SiN is formed at a substrate temperature of higher than 900° C., the surface of the substrate is automatically nitrided, and the buffer body is inevitably formed on the surface-nitrided substrate. It is well known that when GaN is formed on the surface-nitrided substrate, the quality of the GaN layer formed is adversely affected. Therefore, it is desirable that formation of the buffer body be carried out at temperatures at which the surface of the substrate is not yet fully nitrided, which are specifically 900° C. or lower, preferably 700° C. or lower, and more preferably 450° C. to 600° C.

In the present invention, a reduction in the dislocation density of the GaN-based compound semiconductor may cause distortion in the grown GaN-based compound semiconductor. When the GaN-based compound semiconductor is caused to grow directly on the substrate, dislocation occurs. This dislocation alleviates the distortion of the GaN-based compound semiconductor. Such distortion does not become noticeable when the thickness of the GaN-based compound semiconductor layer is very small, but when the distortion increases in proportion to an increase in the layer thickness, problems such as layer cracking may occur.

Thus, in the present invention, a crystal nucleus generation-inhibiting layer is formed discretely prior to the formation of the buffer layer, not only to reduce the dislocation density of the GaN-based compound semiconductor, but also to ensure the alleviation of its distortion. The GaN-based compound semiconductor grows from the portions of the substrate where the crystal nucleus generation-inhibiting layer is not formed and, in time, the growing portions of the GaN-based compound semiconductor proceed in a horizontal direction and meet one another so as to cover the crystal nucleus generation-inhibiting layer. At these meeting portions, the distortion of the GaN-based compound semiconductor layer is alleviated.

Further, in the present invention, an InGaN layer or a superlattice layer having a quantum well structure is formed on the GaN-based compound semiconductor layer, not only to reduce the dislocation density of the GaN-based compound semiconductor, but also to ensure the alleviation of its distortion. Because InGaN is not as hard as GaN, it can alleviate the distortion of the GaN-based compound semiconductor. Meanwhile, the superlattice layer having a quantum well structure can also alleviate the distortion of the GaN-based compound semiconductor because it has large distortion due to lattice mismatching.

Further, the GaN-based compound semiconductor device of the present invention comprises a buffer body which is formed discretely on a substrate or a buffer body having multiple pores which is formed on a substrate; a buffer layer formed on the buffer body; and a GaN-based compound semiconductor layer formed on the buffer layer.

In one embodiment of the present invention, this semiconductor device has a crystal nucleus generation-inhibiting layer between the substrate and the buffer body.

In another embodiment of the present invention, this semiconductor device has an InGaN layer or a superlattice layer having a quantum well structure on the GaN-based compound semiconductor layer.

BREIF DESCRIPTION OF THE DRAWINGS

DETAILED DESCRIPTION OF THE PREFERED EMBODIMENTS

Preferred embodiment of the present invention will hereinafter be described with reference to the drawings.

Figure 1:
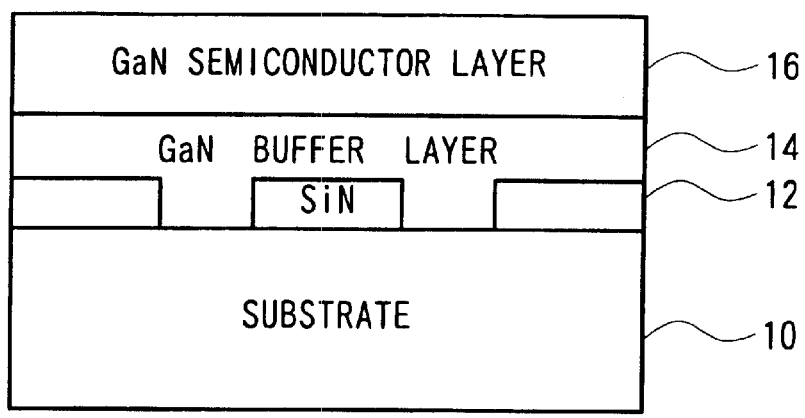
FIG. 1 is a block diagram of the GaN-based compound semiconductor device.

FIG. 1 shows the structure of a GaN-based compound semiconductor produced by the method of a first preferred embodiment. A SiN buffer body 12 is formed discretely on a substrate 10 such as sapphire. On the SiN 12, a GaN buffer layer 14 having a thickness of about 20 nm is formed at low temperatures (such as 500° C.) and then a GaN semiconductor layer 16 having a thickness of about 2 $\mu$m is formed thereon at high temperatures (such as 1,075° C.).

Figure 2:
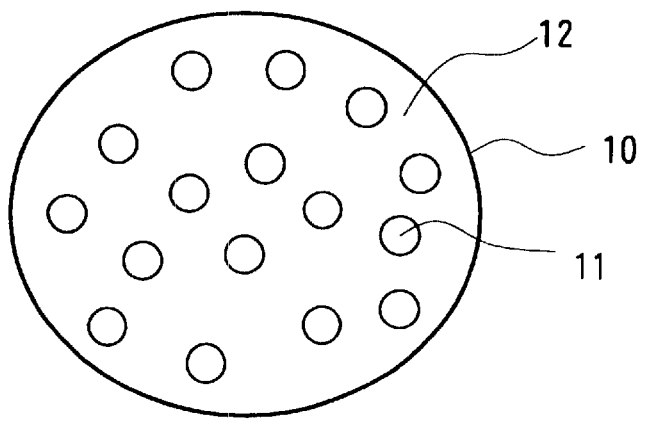
FIG. 2 is a plan view of the SiN buffer body in FIG. 1.

FIG. 2 is a schematic plan view of the SiN buffer body 12 formed on the substrate 10. The SiN buffer body 12 is formed, not in the form of a layer to cover the substrate 10. but discretely. so as to have pores 11, as shown in FIG. 2. That is, a plurality of buffer bodies are discretely formed or a buffer body having a plurality of pores is formed. The SiN buffer body 12 is not formed on the pores 11; that is, the substrate 10 is exposed at these pores. The SiN buffer body 12 formed on the substrate 10 may be amorphous or crystalline and, in either case, exhibits the effect of inhibiting the crystal growth of the low-temperature GaN buffer layer 14 formed thereon.

Figure 3:
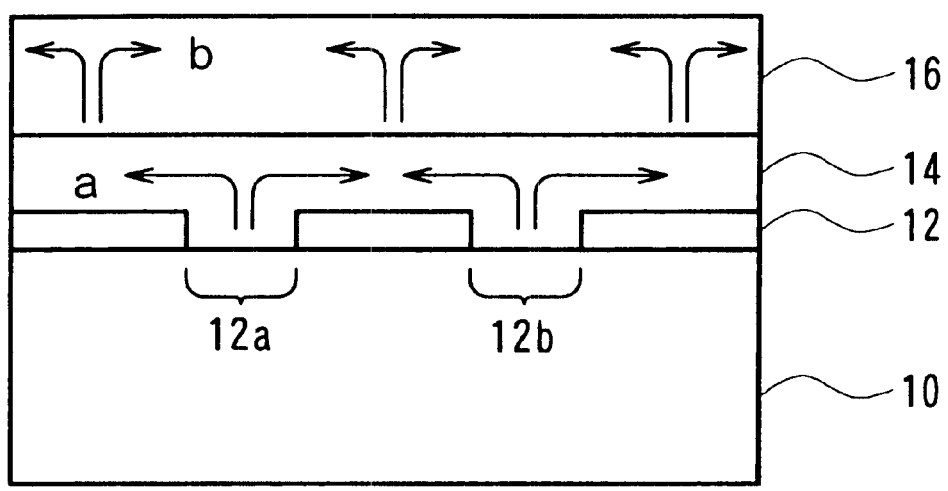
FIG. 3 is an illustration showing crystallization of the GaN-based compound semiconductor.

FIG. 3 is a schematic diagram showing the mechanism of crystallization of the GaN-based compound semiconductor shown in FIGS. 1 and 2. Because the SiN buffer body 12 formed on the substrate is amorphous, the crystal growth of the GaN buffer layer 14 formed at low temperatures occurs, not on the SiN buffer body 12, but in a perpendicular direction from gaps 12a and 12b (corresponding to pores 11 shown in FIG. 2) of the SiN buffer body 12, as shown by the arrows (a) in FIG. 3. This growing crystal is a crystal whose orientation varies depending on the crystal orientation of the substrate 10. The crystal growth started from the gaps 12a and 12b of the SiN buffer body 12 starts in time to proceed in a horizontal direction and forms over the SiN buffer body 12. At this point, since the SiN buffer body 12 itself is amorphous, which means that it does not have specific crystal orientation, the portions of the GaN buffer layer 14 locating over the SiN buffer body 12 are not greatly influenced either by the substrate 10 or by the SiN buffer body 12. Therefore, these portions of the GaN buffer layer 14 are apt to monocrystallize and are free from the occurrence of dislocation. Then, using these portions of the GaN buffer layer 14 as seed crystals, the GaN semiconductor layer 16 grows as shown by the arrows (b) in FIG. 3. As described above, in the present embodiment, the crystallinity of the GaN semiconductor layer 16 is improved by promoting the monocrystallization of the low-temperature GaN buffer layer 14 by using the SiN buffer body 12.

Figure 4:
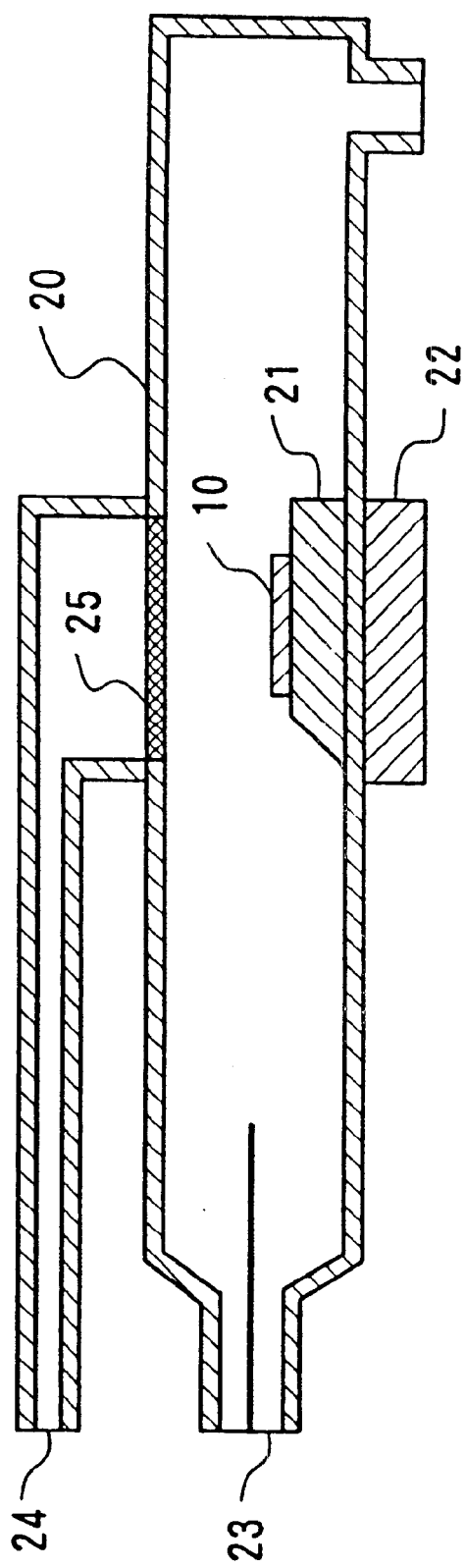
FIG. 4 is a conceptual block diagram of the production device.
Figure 5:
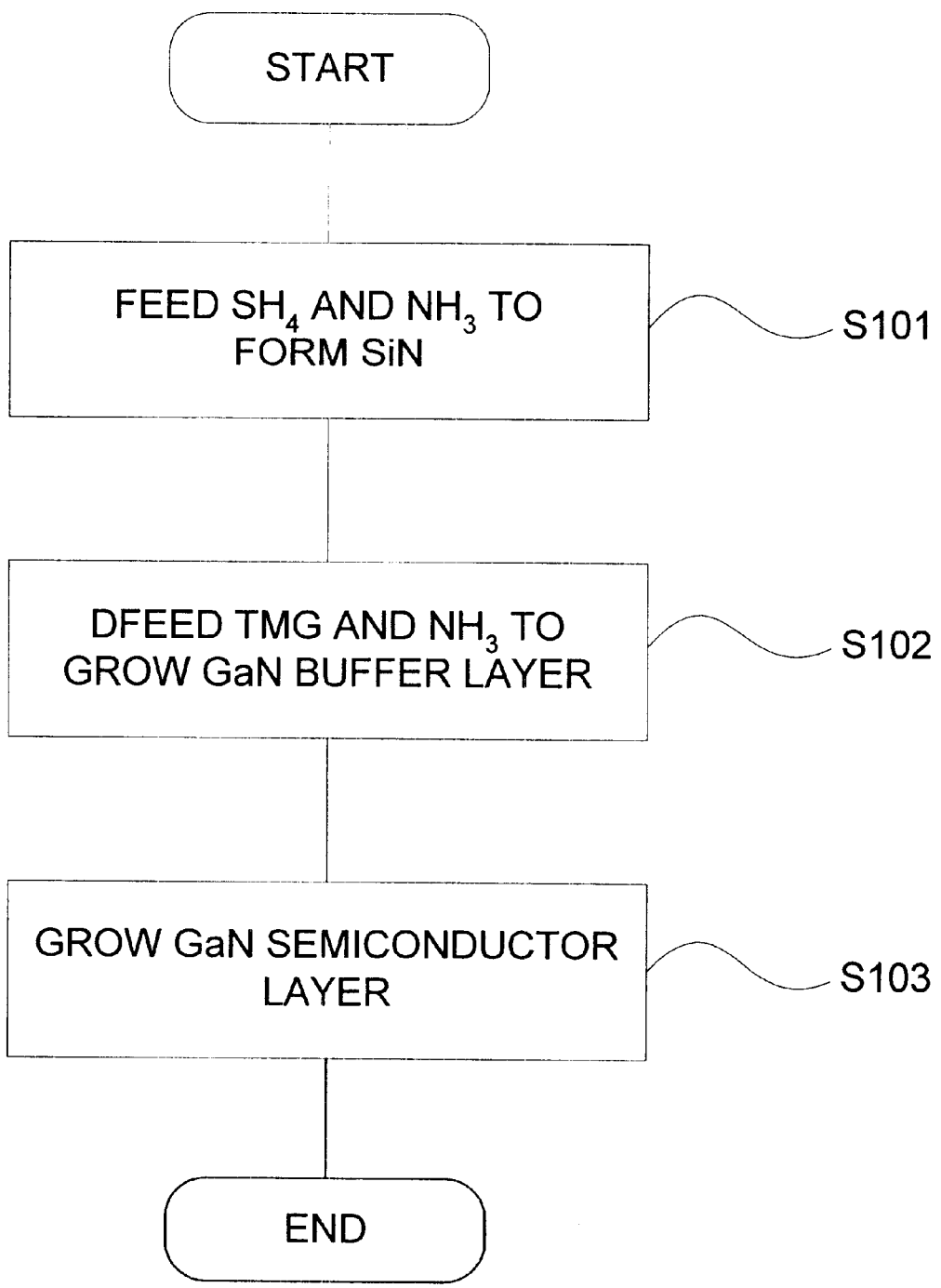
FIG. 5 is a flowchart showing the production process.

FIG. 4 shows a conceptual diagram of the production device for the GaN-based compound semiconductor of the present embodiment, and FIG. 5 shows a flowchart showing the production process. First, a sapphire substrate 10 is placed on a susceptor 21 in a reaction tube 20 to heat-treat the sapphire substrate in an $H_2$ atmosphere by heating it up to 1,150° C. using a heater 22. After the heat treatment, the temperature of the substrate is lowered to 500° C., a mixed gas of $H_2$ and $N_2$ is fed from a gas-introducing port 24 and introduced into the tube via a microporous member 25 having gas permeability, and a silane gas ($SiH_4$), an ammonia gas ($NH_3$) and $H_2$ are fed into the tube from a gas-introducing port 23 to form an SiN buffer body 12 (S101). The flow rate of 7.5 ppm $SiH_4$ diluted in $H_2$ is 20 sccm, and that of 100% $NH_3$ is about 5 slm. The SiN buffer body 12 is desirably formed not at high temperatures over 900° C., but at low temperatures of 900° C. or lower, preferably 700° C. or lower, more preferably 450° C. to 600° C. (for example, 500° C. as have indicated in the present embodiment). When the ammonia gas and the silane gas are brought into contact with the sapphire substrate 10 heated to temperatures over 900° C., for example, temperatures of 1,000° C. or higher, the surface of the sapphire substrate 10 is automatically nitrided, and the SiN buffer body 12 is inevitably formed on the nitrided surface. It is known that the quality of the GaN layer grown on the fully nitrided surface of the substrate is inferior to that of the GaN layer grown on the unnitrided surface of the substrate. It is assumed that this is because the surface of the sapphire ($Al_2O_3$) substrate is converted to AlN by surface nitriding and the surface of AlN is an N surface (AlN has a structure in which aluminum and nitrogen are alternately arranged, and its outermost atom is nitrogen). GaN grown on the nitrogen surface is inferior in layer quality to that grown on an Al or Ga surface. Therefore, when forming the SiN buffer body 12, it is necessary to form the SiN buffer body 12 by bringing the ammonia gas and the silane gas into contact with the sapphire substrate 10 at temperatures at which the surface of the substrate is not fully nitrided. Next, the feeding of $SiH_4$ is stopped, and, with the temperature of the substrate maintained at 500° C., trimethyl gallium (TMG), $NH_3$ and $H_2$ are fed into the tube from the gas-introducing port 23 to grow a GaN buffer layer 14 (S102). The GaN buffer layer 14 is allowed to grow to a size of 20 nm in about 75 seconds. Then, the substrate 10 is heated to 1,075° C. using the heater 22 and TMG, $NH_3$ and $H_2$ are fed into the tube from the gas-introducing port 23 likewise to grow a GaN semiconductor layer (S103). That is, the method of the present embodiment differs from the method of the related art, which comprises the steps of growing a GaN buffer layer on a substrate at low temperatures (of about 500° C.) and then growing a GaN layer at high temperatures (of not lower than 1,000° C.), in that $SiH_4$ and $NH_3$ are fed to the substrate 10 to cause a reaction prior to the growth of the low-temperature buffer layer.

Table 1 shows the properties of the GaN semiconductor produced by varying the formation time of the SiN buffer body 12, that is, the amount of formation thereof.

TABLE 1

| No. | Formation Time of SiN (seconds) | Mobility | X-FW HM | Surface Property |
|---|---|---|---|---|
| 1 | 50 | 258 | 244 | Good |
| 2 | 100 | 381 | 245 | Good |
| 3 | 150 | 281 | 266 | Fair |
| 4 | 125 | 392 | 240 | Excellent |
| 5 | 75 | 332 | 240 | Good |

Table 1 shows five samples prepared and numbered 1, 2, 3, 4 and 5, for which the formation time of the SiN buffer body 12 is set to be 50, 100, 150, 125 and 75 seconds, respectively. The measured properties are mobility ($cm^2$/V·sec), the half-width of an X-ray rocking curve (X-FWHM), and the results of observing a surface property (surface morphology) by a microscope. As for the formation time of SiN, samples Nos. 1, 2 and 5 which are given relatively short formation time as 50 s, 75 s, and 100 s show relatively good surface properties and small X-FWHM values. On the other hand, sample No. 3 given relatively long SiN formation time as 150 s shows only a fair surface property and a relatively large X-FWHM value. It is assumed that this is because the long SiN formation time caused the formation of, not the discrete SiN buffer body 12, but an SiN layer on the substrate 10 and the SiN layer inhibited the crystal growth of the GaN buffer layer 14 and the GaN semiconductor layer 16. In contrast, sample No. 4 given an SiN formation time of 125 s shows excellent surface crystallinity and an extremely small X-FWHM value of 240. Further, sample No. 4 also has a large mobility value of 392, showing the improvement of electric characteristics in proportion to the improvement of crystallinity.

As can be understood from the above, the crystallinity of the GaN semiconductor layer 16 can be improved by forming the SiN buffer body 12 not in the form of a layer, but in the form of multiple spots on the substrate 10 by controlling the formation time of the SiN buffer body 12, that is, the amount of formation thereof.

Figure 6B:
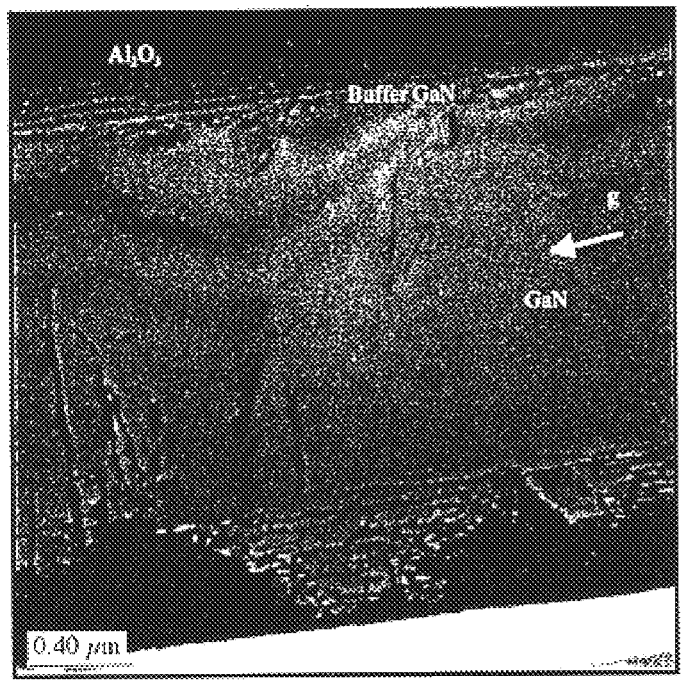
FIG. 6B is a TEM photograph of the device produced by the method of the present invention.
Figure 6A:
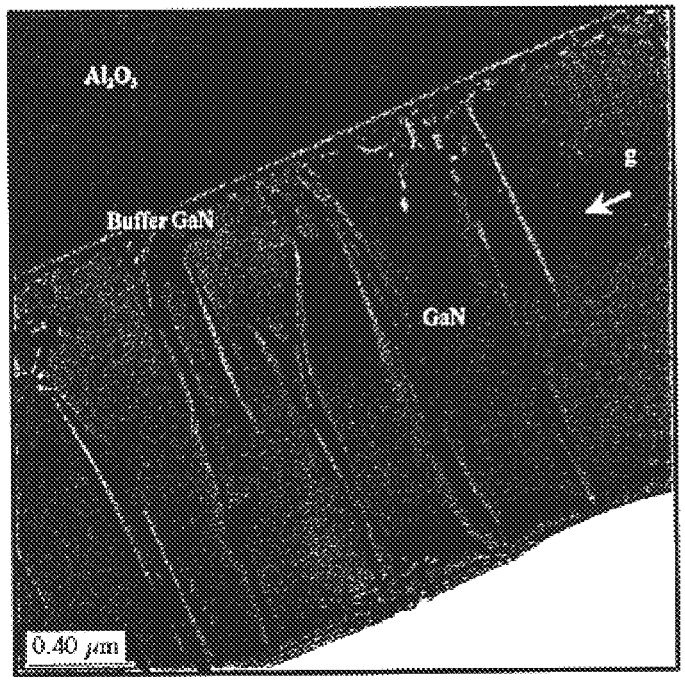
FIG. 6A is a TEM photograph of the device produced by a production method according to a related art.

FIGS. 6A and 6B show transmission electron microscope (TEM) photographs of the sections of the GaN semiconductor produced by the method of the prior art and the GaN semiconductor (corresponding to sample No. 4 in Table 1) produced by the method of the present embodiment. FIG. 6A shows the GaN semiconductor produced by the method of the prior art, while FIG. 6B shows the GaN semiconductor produced by the method of the present embodiment. In FIGS. 6A and 6B, g represents the [2110] direction. FIG. 6A shows that the GaN semiconductor of the related art has a number of filament dislocations occurring from the interface between the low-temperature buffer layer and the GaN layer. On the other hand, unlike FIG. 6A, FIG. 6B shows that the GaN semiconductor of the present embodiment has almost no dislocations occurring from the interface between the low-temperature buffer layer and the GaN layer. Although some dislocations can be recognized in FIG. 6B, these are not from the interface between the low-temperature buffer layer and the GaN layer. Therefore, these dislocations that can be recognized in FIG. 6B are not caused by the low-temperature buffer layer as was true in the prior art. They have occurred as the GaN layer itself has grown and, therefore, can be prohibited from occurring by controlling the growth condition of the GaN layer. The dislocation density of the GaN semiconductor produced by the method of the present embodiment shown in FIG. 6B is significantly lower than that of the GaN semiconductor produced by the method of the prior art shown in FIG. 6A, and is comparable to that of the GaN semiconductor produced by the ELO method. The effect of the method of the present embodiment should be obvious from FIGS. 6A and 6B.

Figure 7:
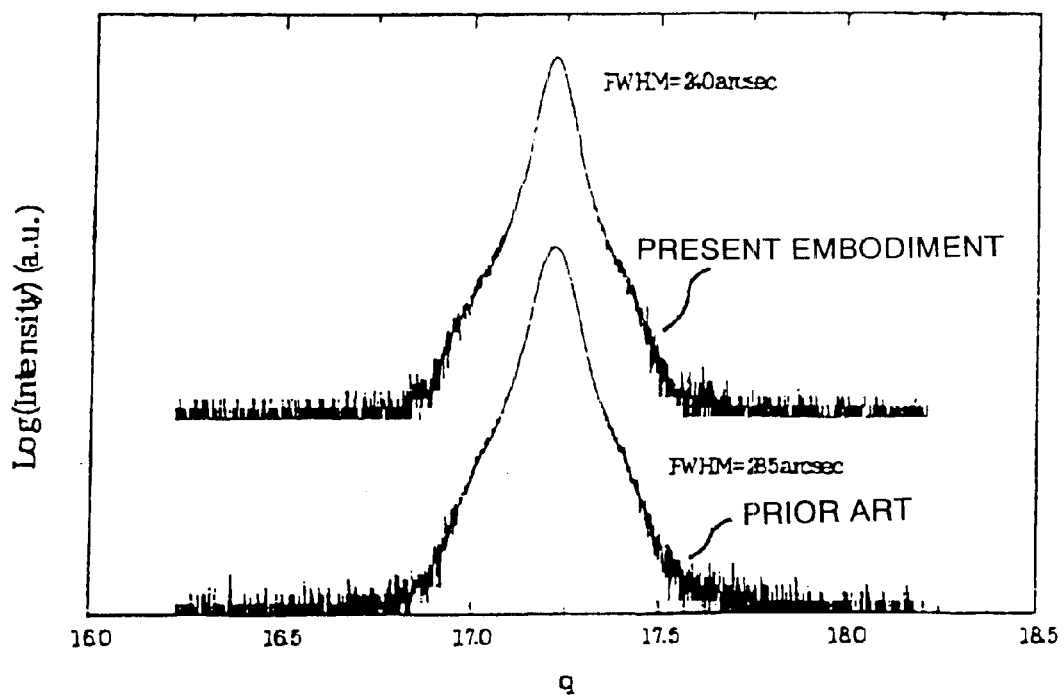
FIG. 7 is a graph showing the result of subjecting the device to an X-ray diffraction analysis.

FIG. 7 shows the resultant spectra of the X-ray diffraction analysis shown in Table 1. FIG. 7 shows the results of subjecting the GaN semiconductor produced by the method of the related art and the GaN semiconductor produced by the method of the present embodiment to the X-ray diffraction analysis. The GaN semiconductor produced by the method of the related art shows a half-width (FWHM) of 285 arcsec, while the GaN semiconductor produced by the method of the present embodiment, as already described above, shows a half-width of 240 arcsec.

Figure 8A:
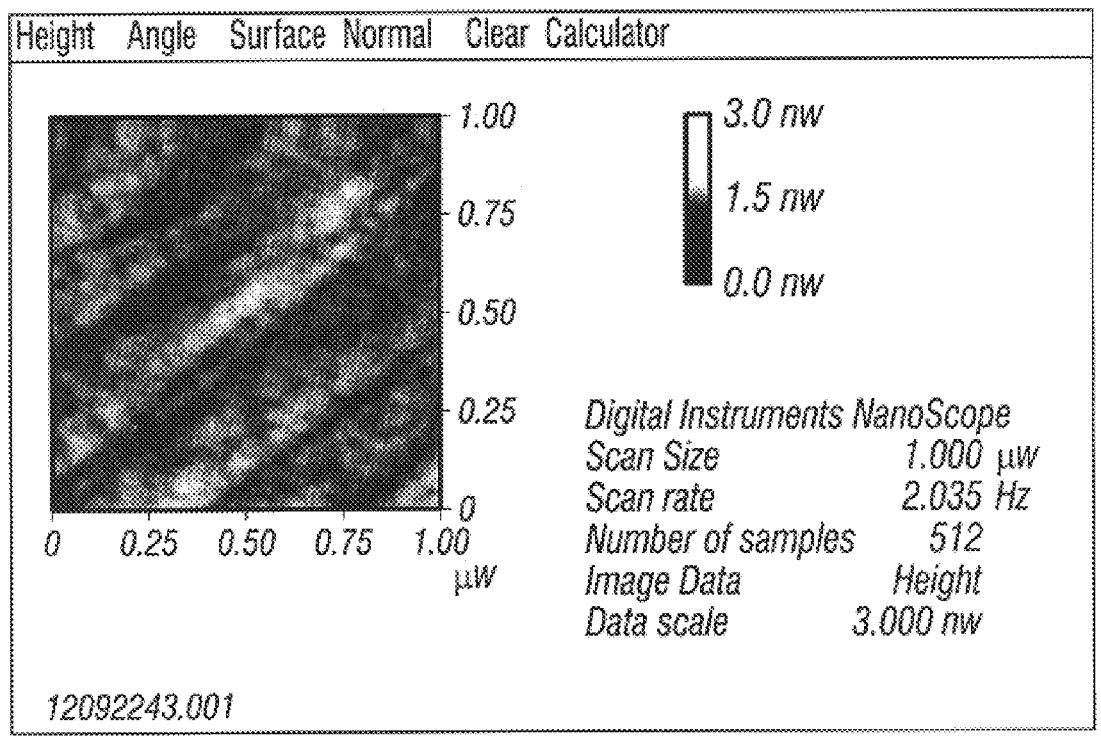
FIG. 8A is an AFM photograph of an SiN buffer body.
Figure 8B:
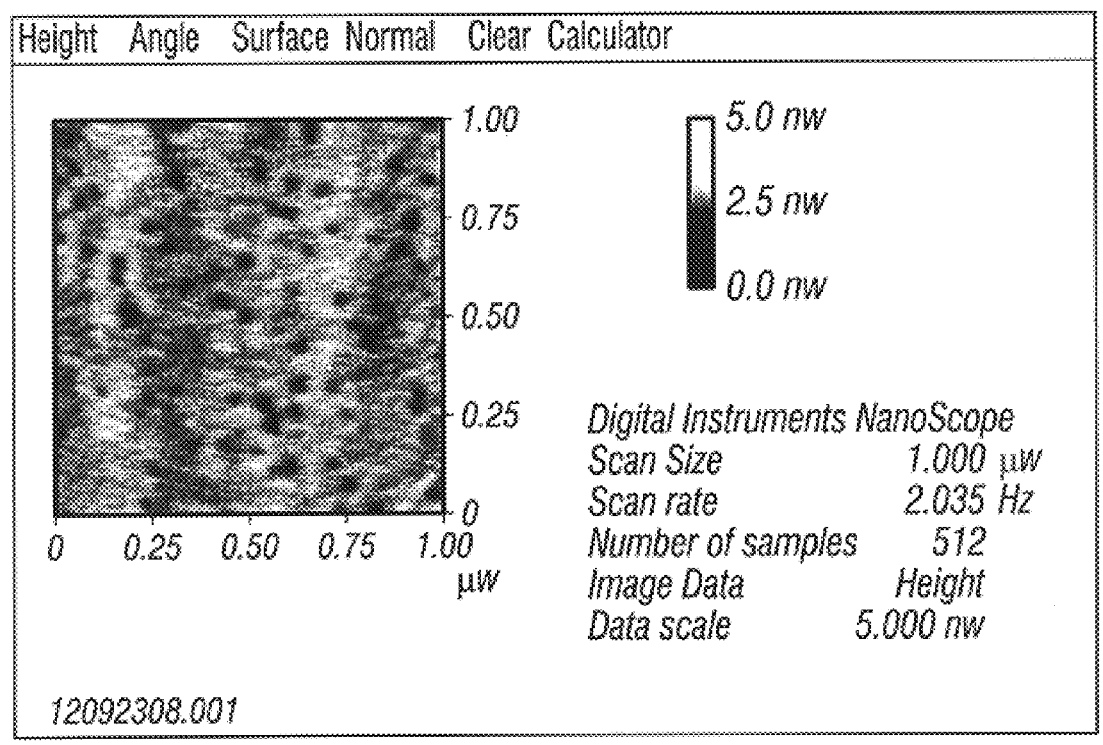
FIG. 8B is an AFM photograph of another SiN buffer body.

FIGS. 8A and 8B show atomic force microscope (AFM) photographs of SiN buffer bodies formed on sapphire substrates by feeding $SiH_4$ and $NH_3$ to the substrates. FIG. 8A shows the photograph of the SiN buffer body formed with an SiN formation time of 50 sec (corresponding to sample No. 1 in Table 1), while FIG. 8B shows the photograph of the SiN buffer body formed with an SiN formation time of 125 sec (corresponding to sample No. 4 in Table 1). FIG. 8B shows that the SiN buffer body formed with the SiN formation time of 125 sec has a number of openings or pores whose size is expressed in nanometers, while FIG. 8A shows no signs of such openings or pores. The photograph of FIG. 8B corresponds to FIG. 2, and it is assumed that these openings or pores contribute to a reduction in dislocation density. That is, it is assumed that by having such openings or pores on SiN, in other words, by forming SiN, not in the form of a continuous layer, but discretely or in the form of islands, the crystal growth of the low-temperature buffer layer in a horizontal direction is promoted, with the result of inhibiting the occurrence of dislocations.

Although SiN is used as the buffer body in the present embodiment, other materials that can inhibit the crystal growth of the buffer body, such as Si and $SiO_2$, can also be used.

Further, although GaN is used as the buffer layer in the present embodiment, GaAlN or AlN can also be used, and the thickness of the buffer layer can be made smaller than 20 nm. The same applies to the gallium nitride-based compound semiconductor layer, which means that GaAlN can be used in place of GaN.

In the present embodiment, when the GaN semiconductor layer 16 is formed in the manner as described above, dislocation density thereof is significantly reduced. However, distortion remains in the GaN semiconductor layer 16, and in proportion to an increase in the thickness of the GaN semiconductor layer 16, its stress also increases. In some cases, the GaN semiconductor layer 16 may be cracked.

Consequently, by the addition of another production step, the reduction of the dislocation density and the alleviation of the distortion may be achieved simultaneously.

Figure 9:
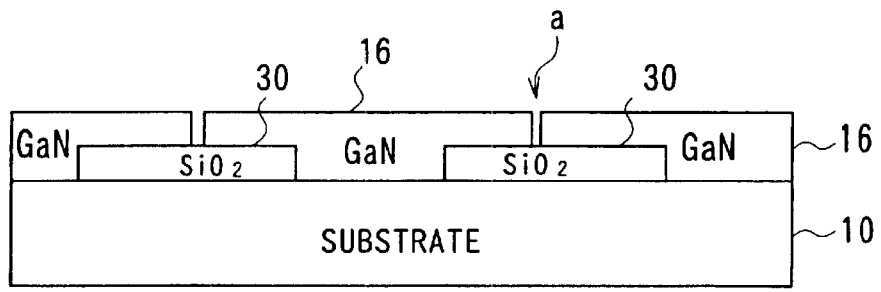
FIG. 9 is a block diagram of another GaN-based compound semiconductor device.

FIG. 9 shows the structure of the GaN-based compound semiconductor produced by the production method of the present embodiment. The structure of FIG. 9 is different from that of FIG. 1 in that $SiO_2$ 30 as a crystal nucleus generation-inhibiting layer is formed discretely on the substrate 10 such as sapphire prior to the formation of the SiN buffer body 12 and the low-temperature GaN buffer layer 14 on the substrate 10. That is, $SiO_2$ 30 is first formed discretely on the substrate 10, and then, the GaN-based compound semiconductor is formed, following the flowchart shown in FIG. 5. $SiO_2$ 30 can be formed discretely by first forming $SiO_2$ on the substrate 10 by, for example, electron beam evaporation or chemical-vapor deposition and then removing some portions of $SiO_2$ by etching or the like. As an example, $SiO_2$ 30 can be formed in the form of stripes each of which has a width of 2 to 50 µm, preferably 5 to 20 µm, and is apart from adjacent stripes with a distance which is almost the same as the width.

When the buffer body 12, the GaN buffer layer 14 and the GaN semiconductor layer 16 are formed on $SiO_2$ 30 which has been formed as described above, these layers grow from the openings of $SiO_2$ 30, that is, the portions of the substrate 10 which are devoid of $SiO_2$ 30, start in time to grow in a horizontal direction so as to cover $SiO_2$ 30, and meet the layers growing out of other openings. At these meeting portions (one of which is shown by (a) in FIG. 9), the distortion within the GaN semiconductor layer 16 is alleviated, whereby a good GaN semiconductor layer 16 which has low dislocation density and small distortion can be obtained.

Other materials that are completely or almost free from the generation of crystal nuclei, such as SiN and Si, can be used in place of $SiO_2$.

Figure 10:
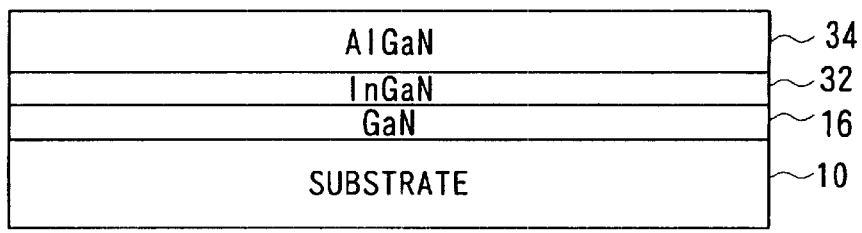
FIG. 10 is a block diagram of still another GaN-based compound semiconductor device.

Further, FIG. 10 shows the structure of the GaN-based compound semiconductor produced by the production method of another embodiment. The structure of FIG. 10 is different from that of FIG. 1 in that an InGaN layer 32 is formed on the GaN semiconductor layer 16 and an AlGaN layer 34 is formed on the InGaN layer 32 to form the device structure. That is, after the GaN semiconductor layer 16 is formed by following the flowchart shown in FIG. 5, the InGaN layer 32 is formed, followed by the formation of the AlGaN layer 34. Since the GaN semiconductor layer 16 does not have many dislocations to alleviate distortion, distortion may still remain within the layer 16. However, since the hardness of the InGaN layer 32 formed thereon is lower than that of the GaN semiconductor layer 16 (InGaN is softer than GaN), the distortion of the GaN semiconductor layer 16 is assimilated by the InGaN layer 32, whereby a device structure which is free from cracking can be obtained.

The thickness of the GaN semiconductor layer 16 can be such that the layer 16 is not cracked by its distortion, which is, for example, about 0.1 to 3 µm, while the thickness of the InGaN layer 32 can be set to be 0.001 to 1 µm. Further, the content of In in the InGaN layer 32 may be, for example, 0.02 to 0.5 wt %, preferably 0.05 to 0.2 wt %.

Further, a GaN or InGaN layer can be used in place of the AlGaN layer 34.

Figure 11:
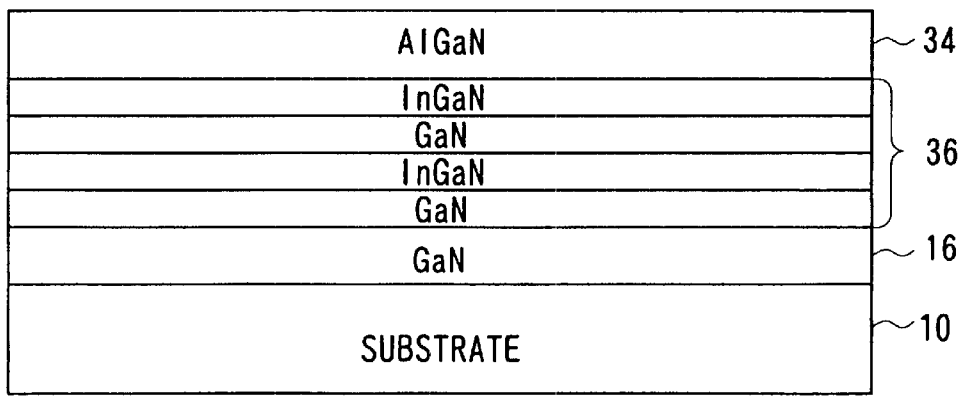
FIG. 11 is a block diagram of still another GaN-based compound semiconductor device.

FIG. 11 shows the structure of the GaN-based compound semiconductor produced by the production method of still another embodiment. The structure of FIG. 11 is different from that of FIG. 1 in that a superlattice layer 36 having a quantum well structure (or a multilayer quantum well MQW) is formed on the GaN semiconductor layer 16 and the AlGaN layer 34 is then formed on the superlattice layer 36 to form the device structure. That is, after the GaN semiconductor layer 16 is formed by following the flowchart shown in FIG. 5, the superlattice layer 36 is formed, followed by the formation of the AlGaN layer 34. The superlattice layer 36 may be formed, for example, by alternately laminating InGaN and GaN, as shown in FIG. 11. Each of the layers constituting the superlattice layer 36 may have a thickness of 1 to 100 nm, preferably 2 to 3 nm. FIG. 11 shows that the InGaN/GaN super lattice layer 36 comprises only two pitches. This is for the sake of convenience, as a matter of course, and the number of the pitches may be expressed by "n" (n is any number from 1 to 300, preferably around 20). Within the super lattice layer 36 (or multilayer quantum well MQW) exists a large amount of distortion due to lattice mismatching. Therefore, by this layer, the influence of the distortion of the GaN semiconductor layer 16 on the AlGaN layer 34 can be inhibited.

As combinations of layers constituting the super lattice layer 36, AlGaN/GaN or InGaN/AlGaN can also be used, in addition to InGaN/GaN.

Further, a GaN or InGaN layer can be used in place of the AlGaN layer 34.

Figure 12:
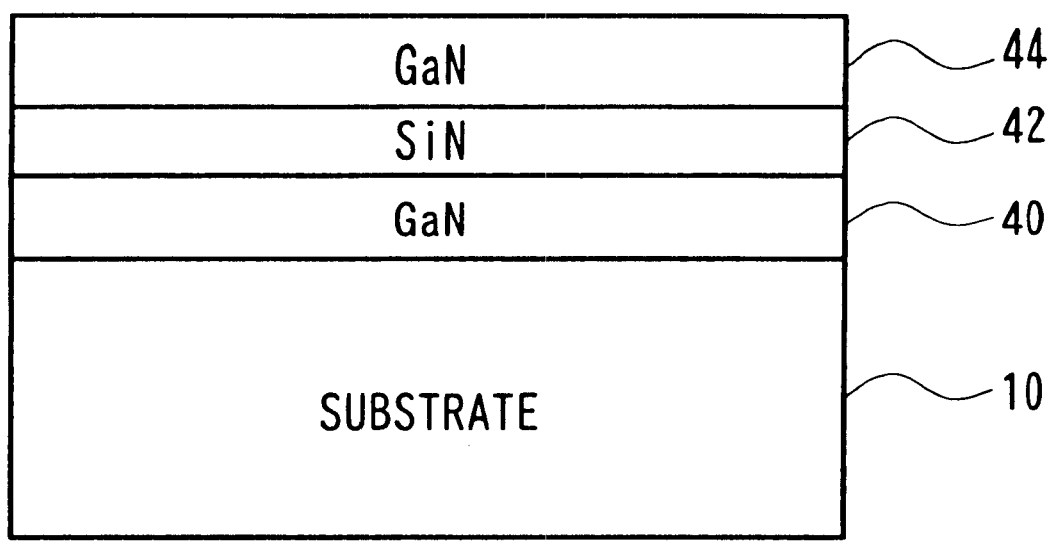
FIG. 12 is a block diagram of yet another GaN-based compound semiconductor device.

FIG. 12 shows the structure of the GaN-based compound semiconductor produced by the production method of yet another embodiment. A GaN semiconductor layer 40 is formed on the substrate 10, and a SiN buffer body 42 is formed thereon. The GaN semiconductor layer 40 does not require formation at a low temperature (e.g., 500° C.), as is required by the GaN buffer layer 14 in FIG. 1, and can be formed at a desired temperature, having desired width. For example, a GaN layer 40 can be formed under the same condition as that for the GaN semiconductor layer 16 in FIG. 1. A SiN buffer body 42 can be formed in the same process as that for the SiN buffer body 12 in FIG. 1. For example, a SiN buffer body 42 can be formed at a substrate temperature of 400° C. to 1200° C., using silane gas and ammonia gas supplied. After the formation of SiN buffer body 42, a GaN semiconductor layer 44 is formed again. Due to the presence of the SiN buffer body 42, dislocation density of the GaN semiconductor layer 44 can be reduced.

It should be noted that, although a SiN buffer body 42 is inserted into the GaN semiconductor layers 40, 44 only once, growth of the GaN semiconductor layers 40, 44 may be discontinued at more than two times, as necessary, so that a SiN buffer body 42 may be inserted every time of discontinuation.

Also note that AlGaN may be used in the place of GaN in FIG. 12.

Figure 13:
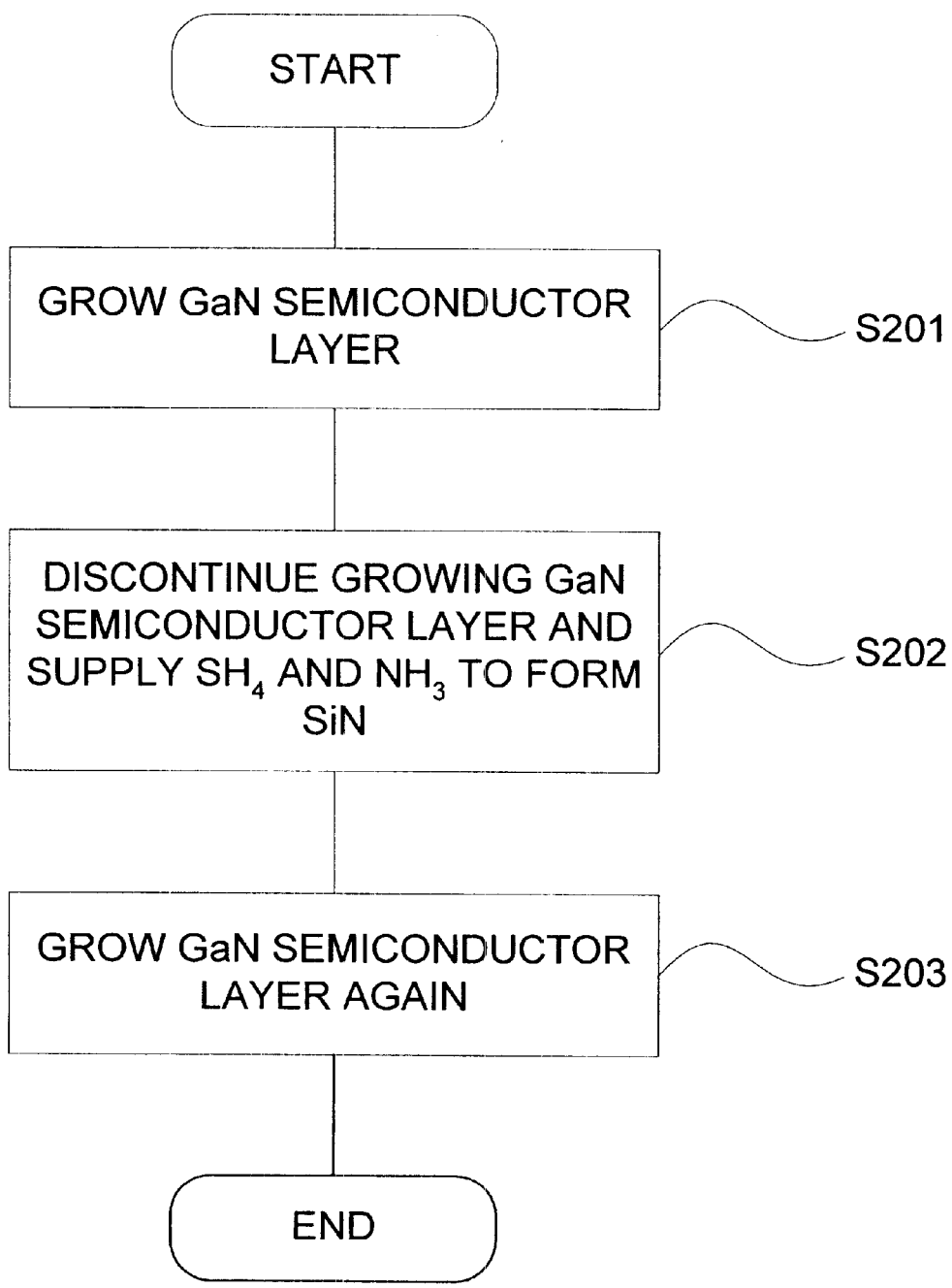
FIG. 13 is a flowchart showing the production process of the GaN-based compound semiconductor device shown in FIG. 12.

FIG. 13 is a flowchart showing the production process for the case shown in FIG. 12. Initially, a GaN semiconductor layer 40 is formed on a substrate (S201). Low temperature is not required as formation condition, and the layer 40 can be formed at a substrate temperature of, for example, 1000° C. or higher. Subsequently, growth of the GaN semiconductor layer 40 is temporarily discontinued, and silane gas and ammonia gas are introduced into a reaction tube to form SiN (S202). Silane gas and ammonia gas may be supplied for a period of time long enough for the SiN to be formed discretely (a few seconds). After the formation of SiN, TMG, ammonia, and $H_2$ are supplied again to grow the GaN semiconductor layer 44 (S203).

Moreover, although SiN is used as the buffer body in the above embodiments, other materials that can inhibit the crystal growth of the buffer layer, such as Si and $SiO_2$, can also be used.

Further, although GaN is used as the buffer layer in the above embodiments, GaAlN or AlN can also be used, and the thickness of the buffer layer can be made smaller than 20 nm. The same applies to the gallium nitride-based compound semiconductor layer, which means that GaAlN can be used in place of GaN.

What is claimed is:

1. A method for producing a GaN-based compound semiconductor, comprising the steps of:
   (a) forming a buffer body discretely on a substrate;
   (b) forming a buffer layer on the buffer body; and
   (c) forming a GaN-based compound semiconductor on the buffer layer, wherein the buffer body is formed when a temperature of the substrate is 900° C. or less.

2. The method according to claim 1, wherein the buffer body is made of Si or an Si compound.

3. The method according to claim 1, wherein a crystal nucleus generation-inhibiting layer is formed discretely on the substrate prior to the step (a).

4. The method according to claim 3, wherein the crystal nucleus generation-inhibiting layer is formed in the form of stripes of $SiO_2$, SiN or Si at a predetermined interval.

5. The method according to claim 1, which further includes the step (d) of forming an InGaN layer on the GaN-based compound semiconductor.

6. The method according to claim 1, which further includes the step (d) of forming a superlattice layer having a quantum well structure on the GaN-based compound semiconductor.

7. The method according to claim 6, wherein the superlattice layer is formed by alternately laminating InGaN and GaN.

8. A method for producing a GaN-based compound semiconductor, comprising the steps of:
   (a) forming a crystal nucleus generation-inhibiting layer discretely on a substrate;
   (b) forming a buffer body having multiple pores on the substrate;
   (c) forming a buffer layer on the buffer body; and
   (d) forming a GaN-based compound semiconductor on the buffer layer.

9. The method according to claim 8, wherein the buffer body is made of Si or an Si compound.

10. The method according to claim 8, wherein the buffer body is formed when the temperature of the substrate is 900° C. or less.

11. The method according to claim 8, wherein the crystal nucleus generation-inhibiting layer is formed in the form of stripes of $SiO_2$, SiN or Si at a predetermined interval.

12. The method according to claim 8, which further includes the step (d) of forming an InGaN layer on the GaN-based compound semiconductor.

13. The method according to claim 8, which further includes the step (d) of forming a superlattice layer having a quantum well structure on the GaN-based compound semiconductor.

14. The method according to claim 13, wherein the superlattice layer is formed by laminating InGaN and GaN alternately.

15. A method for producing a GaN-based compound sermiconductor, comprising:
   (a) forming a crystal nucleus generation-inhibiting layer discretely on a substrate;
   (b) feeding $SiH_4$ and $NH_3$ to the substrate, wherein the amounts of $SiH_4$ and $NH_3$ to be fed are chosen such that an Si compound is formed in the form of islands on the substrate;
   (c) forming a buffer layer on the substrate; and
   (d) forming a GaN-based compound semiconductor on the buffer layer.

16. The method according to claim 15, wherein $SiH_4$ and $NH_3$ are fed when the temperature of the substrate is 900° C. or less.

17. The method according to claim 15, wherein the crystal nucleus generation-inihibiting layer is formed in a pattern of stripes of $SiO_2$, SiN or Si at a predetermined interval.

18. The method according to claim 15, which further includes a step (d) of forming an InGaN layer on the GaN-based compound semiconductor.

19. The method according to claim 15, which further includes a step (d) of forming a superlattice layer having a quantum well structure on the GaN-based compound semiconductor.

20. The method according to claim 19, wherein the superlattice layer is formed by alternately laminating InGaN and GaN.

21. A method for producing a GaN-based compound semiconductor, comprising the steps of:
   (a) forming a GaN-based compound semiconductor on a substrate;
   (b) discontinuing formation of the GaN-based compound semiconductor to form a SiN buffer body discretely; and
   (c) forming another GaN-based compound semiconductor on the SiN buffer body, wherein the SiN buffer body is formed when a temperature of the substrate is 400° C. to 1200° C.

* * * * *

UNITED STATES PATENT AND TRADEMARK OFFICE
CERTIFICATE OF CORRECTION

PATENT NO. : 6,475,882 B1
DATED : November 5, 2002
INVENTOR(S) : Shiro Sakai et al.

It is certified that error appears in the above-identified patent and that said Letters Patent is hereby corrected as shown below:

<u>Title page,</u>
Insert:

Item -- [30]     Foreign Application Priority Data

December 12, 1999     (JP)     11-376842
    May 16, 2000          (JP)     143826
    June 22, 2000         (JP)     227963 --

Signed and Sealed this

Thirteenth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,475,882 B1
DATED          : November 5, 2002
INVENTOR(S)    : Shiro Sakai et al.

It is certified that error appears in the above-identified patent and that said Letters Patent is hereby corrected as shown below:

In section (30) corresponding to the Foreign Application Priority Data, insert:

December 20, 1999    Japanese Patent Application No. HEI 11-376842
May 16, 2000         Japanese Patent Application No. 2000-143826
June 22, 2000        Japanese Patent Application No. 2000-227963

This certificate supersedes Certificate of Correction issued May 13, 2003.

Signed and Sealed this

Third Day of June, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,475,882 B1
DATED         : November 5, 2002
INVENTOR(S)   : Shiro Sakai et al.

It is certified that error appears in the above-identified patent and that said Letters Patent is hereby corrected as shown below:

<u>Title page,</u>
Item [73], Assignee, please add: -- Shiro Sakai, Tokushima (JP) --

Signed and Sealed this

Sixth Day of April, 2004

JON W. DUDAS
*Acting Director of the United States Patent and Trademark Office*